United States Patent
Le et al.

(10) Patent No.: US 12,176,132 B2
(45) Date of Patent: *Dec. 24, 2024

(54) HIGHLY TEXTURED 001 BiSb AND MATERIALS FOR MAKING SAME

(71) Applicant: Western Digital Technologies, Inc., San Jose, CA (US)

(72) Inventors: Quang Le, San Jose, CA (US); Brian R. York, San Jose, CA (US); Cherngye Hwang, San Jose, CA (US); Xiaoyong Liu, San Jose, CA (US); Michael A. Gribelyuk, San Jose, CA (US); Xiaoyu Xu, San Jose, CA (US); Randy G. Simmons, San Jose, CA (US); Kuok San Ho, Emerald Hills, CA (US); Hisashi Takano, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 173 days.

This patent is subject to a terminal disclaimer.

(21) Appl. No.: 17/855,045

(22) Filed: Jun. 30, 2022

(65) Prior Publication Data

US 2024/0006109 A1  Jan. 4, 2024

(51) Int. Cl.
*H01F 10/32* (2006.01)
*C23C 8/12* (2006.01)
(Continued)

(52) U.S. Cl.
CPC ............. *H01F 10/324* (2013.01); *C23C 8/12* (2013.01); *C30B 29/52* (2013.01); *G11B 5/3909* (2013.01);
(Continued)

(58) Field of Classification Search
CPC ............. H01F 10/324; H01F 10/3254; H01F 10/3286; H01F 10/329; C23C 8/12;
(Continued)

(56) References Cited

U.S. PATENT DOCUMENTS 10,608,167 B2 * 3/2020 Nikonov ............... H10N 52/80
10,991,874 B2 * 4/2021 Tan ....................... H10N 50/80
(Continued)

FOREIGN PATENT DOCUMENTS

JP       2021057357 A       4/2021

OTHER PUBLICATIONS

Yuan et al. One-dimensional thermoelectrics induced by Rashba spin-orbit coupling in two-dimensional BiSb monolayer. Nano Energy 52 (2018) 163-170. (Year: 2018).*

(Continued)

*Primary Examiner* — Allison Bernstein
(74) *Attorney, Agent, or Firm* — PATTERSON + SHERIDAN, LLP (57) ABSTRACT

The present disclosure generally relates to spin-orbit torque (SOT) device comprising a first bismuth antimony (BiSb) layer having a (001) orientation. The SOT device comprises a first BiSb layer having a (001) orientation and a second BiSb layer having a (012) orientation. The first BiSb layer having a (001) orientation is formed by depositing an amorphous material selected from the group consisting of: B, Al, Si, SiN, Mg, Ti, Sc, V, Cr, Mn, Y, Zr, Nb, AlN, C, Ge, and combinations thereof, on a substrate, exposing the amorphous material to form an amorphous oxide surface on the amorphous material, and depositing the first BiSb layer on the amorphous oxide surface. By utilizing a first BiSb layer having a (001) orientation and a second BiSb having a (012) orientation, the signal through the SOT device is balanced and optimized to match through both the first and second BiSb layers.

24 Claims, 10 Drawing Sheets

(51) Int. Cl.
*C30B 29/52* (2006.01)
*G11B 5/00* (2006.01)
*G11B 5/39* (2006.01)
*H10B 61/00* (2023.01)
*H10N 50/85* (2023.01)
*H10N 52/00* (2023.01)
*H10N 52/01* (2023.01)
*H10N 52/80* (2023.01)

(52) U.S. Cl.
CPC ............. *H10B 61/00* (2023.02); *H10N 50/85* (2023.02); *H10N 52/00* (2023.02); *H10N 52/01* (2023.02); *H10N 52/80* (2023.02); G11B 2005/0021 (2013.01); G11B 2005/0024 (2013.01)

(58) Field of Classification Search
CPC ... C23C 28/023; C23C 28/026; C23C 28/323; C23C 28/345; C30B 29/52; G11B 5/3909; G11B 2005/0021; G11B 2005/0024; H10B 61/00; H10N 50/85; H10N 52/00; H10N 52/01; H10N 52/80; H10N 50/01; H10N 50/10
See application file for complete search history.

(56) References Cited

U.S. PATENT DOCUMENTS

| | | | |
|---|---|---|---|
| 11,094,338 B1* | 8/2021 | Hwang | ............... G11B 5/315 |
| 2017/0179036 A1 | 6/2017 | Chen et al. | |
| 2020/0335334 A1 | 10/2020 | Cheng et al. | |
| 2021/0249038 A1 | 8/2021 | Le et al. | |

OTHER PUBLICATIONS

Khang, N.H.D., et al., "A conductive topological insulator with large spin Hall effect for ultralow power spin-orbit torque switching", Nature Materials, vol. 17, pp. 808-813, (Jul. 30, 2018) (Abstract only).

* cited by examiner

HIGHLY TEXTURED 001 BiSb AND MATERIALS FOR MAKING SAME

BACKGROUND OF THE DISCLOSURE

Field of the Disclosure

Embodiments of the present disclosure generally relate to spin-orbit torque (SOT) device comprising a bismuth antimony (BiSb) layer having a (001) orientation.

Description of the Related Art

BiSb layers are narrow band gap topological insulators with both giant spin Hall effect and high electrical conductivity. BiSb is a material that has been proposed in various spin-orbit torque (SOT) device applications, such as for a spin Hall layer for readers in magnetic recording devices, magnetoresistive random access memory (MRAM) devices and energy-assisted magnetic recording (EAMR) write heads.

However, utilizing BiSb materials in commercial SOT applications can present several obstacles. For example, BiSb materials have low melting points, large grain sizes, significant Sb migration issues upon thermal annealing due to its film roughness, difficulty maintaining a desired (012) or (001) orientation for maximum spin Hall effect, and are generally soft and easily damaged by ion milling.

Therefore, there is a need for an improved SOT device utilizing BiSb layer(s) having a desired crystal orientation and a high signal-to-noise ratio.

SUMMARY OF THE DISCLOSURE

The present disclosure generally relates to spin-orbit torque (SOT) device comprising a first bismuth antimony (BiSb) layer having a (001) orientation. The first BiSb layer having a (001) orientation is formed by depositing an amorphous material selected from the group consisting of: B, Al, Si, Mg, Ti, Sc, V, Cr, Mn, Y, Zr, Nb, AlN, C, Ge, and combinations thereof, on a substrate, exposing the amorphous material to form an amorphous oxide surface on the amorphous material, and depositing the first BiSb layer on the amorphous oxide surface. This enables the BiSb with the (001) orientation to have the proper texture to support enhanced SOT device performance.

Additionally, a SOT device is disclosed which comprises a first BiSb layer having a (001) orientation and a second BiSb layer having a (012) orientation. Such a device may be used in a magnetic sensor application, such as in a reader in magnetic recording. By utilizing a first BiSb layer having a (001) orientation and a second BiSb having a (012) orientation, the signal through the SOT device is balanced and optimized to match through both the first and second BiSb layers.

In one embodiment, a method of forming a spin-orbit torque (SOT) device, the method comprises depositing an amorphous material on a substrate, the amorphous material being selected from the group consisting of: B, Al, Si, SiN, Mg, Ti, Sc, V, Cr, Mn, Y, Zr, Nb, AlN, C, Ge, and combinations thereof, exposing the amorphous material to air to form an amorphous material oxide surface on the amorphous material, and depositing a first BiSb layer on the amorphous material oxide surface, the first BiSb layer having a (001) orientation.

In another embodiment, a spin-orbit torque (SOT) device comprises a first spin Hall effect layer comprising BiSb having a (012) orientation, a first free layer disposed over the first spin Hall effect layer, a second free layer disposed over the first free layer, and a second spin Hall effect layer disposed over the second free layer, the second spin Hall effect layer comprising BiSb having a (001) orientation.

In yet another embodiment, a spin-orbit torque (SOT) device comprises a first shield, a first interlayer disposed on the first shield, a first spin Hall effect layer disposed on the first interlayer, the first spin Hall effect layer comprising BiSb having a (012) orientation, a first free layer disposed over the first spin Hall effect layer, a gap layer disposed on the first free layer, a second free layer disposed over the gap layer, a second interlayer disposed over the second free layer, the second interlayer comprising an amorphous oxide material, wherein the first interlayer and the second interlayer comprise different materials, a second spin Hall effect layer disposed on the second interlayer, the second spin Hall effect layer comprising BiSb having a (001) orientation, and a second shield disposed over the second spin Hall effect layer.

In yet another embodiment, a spin-orbit torque (SOT) device comprises a substrate, an amorphous material oxide layer disposed over the substrate, a spin Hall effect layer disposed in contact with the amorphous material oxide layer, the spin Hall effect layer comprising BiSb having a (001) orientation, and a free layer disposed over the spin Hall effect layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to spin-orbit torque (SOT) device comprising a first bismuth antimony (BiSb) layer having a (001) orientation. The first BiSb layer having a (001) orientation is formed by depositing an amorphous material selected from the group consisting of: B, Al, Si, SiN, Mg, Ti, Sc, V, Cr, Mn, Y, Zr, Nb, AlN, C, Ge, and combinations thereof, on a substrate, exposing the amorphous material to form an amorphous oxide surface on the amorphous material, and depositing the first BiSb layer on the amorphous oxide surface. This enables the BiSb with the (001) orientation to have the proper texture to support enhanced SOT device performance.

Additionally, a SOT device is disclosed which comprises a first BiSb layer having a (001) orientation and a second BiSb layer having a (012) orientation. Such a device may be used in a magnetic sensor application, such as in a reader in magnetic recording. By utilizing a first BiSb layer having a (001) orientation and a second BiSb having a (012) orientation, the signal through the SOT device is balanced and optimized to match through both the first and second BiSb layers.

A BiSb layer having a (012) orientation or a (001) orientation has a significant spin Hall angle and high electrical conductivity. Therefore, a BiSb layer having a (012) orientation or a (001) orientation can form a SOT device. For example, a BiSb layer having a (012) orientation or a (001) orientation can be used as a spin Hall layer in a spin-orbit torque device in a magnetic recording head, e.g., as part of a write head (e.g., MAMR) or read head. In another example, a BiSb layer having a (012) orientation or a (001) orientation can be used in nano oscillator devices for reading head applications where a signal is detected in the frequency domain. In another example, a BiSb layer having a (012) orientation or a (001) orientation can be used as a spin Hall electrode layer in an MRAM device. The SOT device can be in a perpendicular stack configuration or an in-plane stack configuration. The SOT device can be utilized in, for example, MAMR writing heads, read head, nano-oscillator based readers, magnetic sensors, MRAM, artificial intelligence chips, and other applications.

Figure 1:
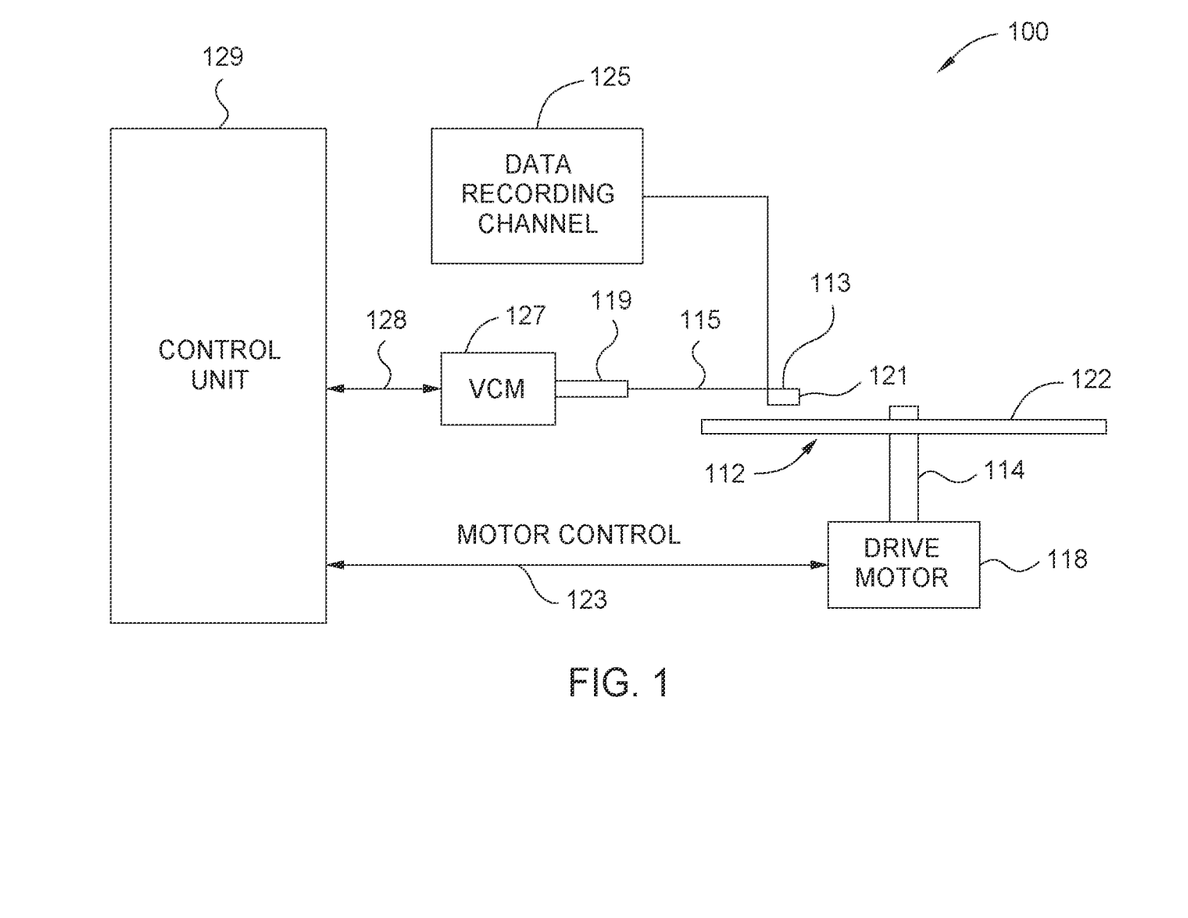
FIG. 1 is a schematic illustration of certain embodiments of a magnetic media drive including a magnetic recording head having a SOT device.

FIG. 1 is a schematic illustration of certain embodiments of a magnetic media drive 100 including a magnetic recording head having a SOT device. Such a magnetic media drive may be a single drive or comprise multiple drives. For the sake of illustration, a single disk drive 100 is shown according to certain embodiments. As shown, at least one rotatable magnetic disk 112 is supported on a spindle 114 and rotated by a drive motor 118. The magnetic recording on each magnetic disk 112 is in the form of any suitable patterns of data tracks, such as annular patterns of concentric data tracks (not shown) on the magnetic disk 112.

Figure 2:
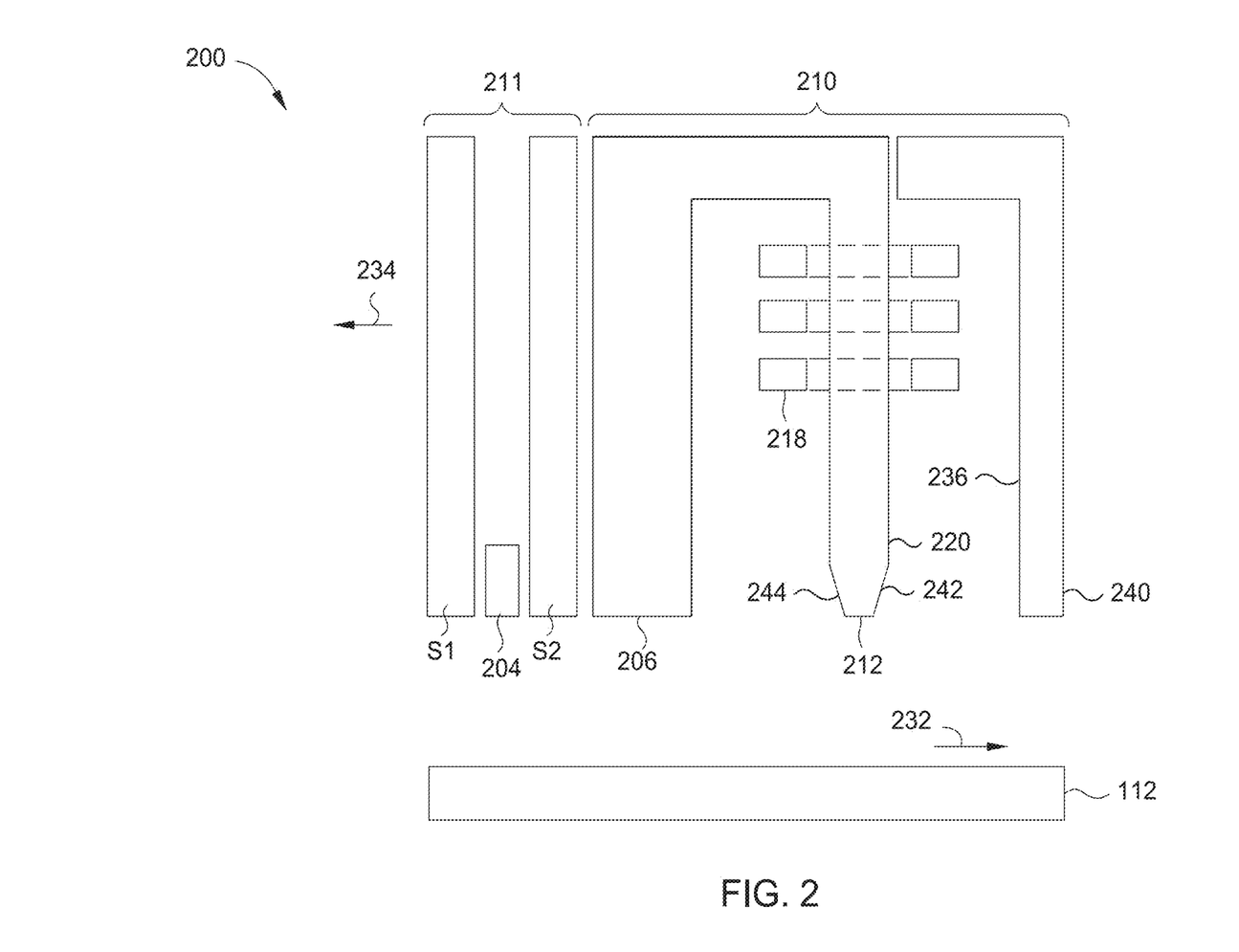
FIG. 2 is a fragmented, cross-sectional side view of certain embodiments of a read/write head having a SOT device.

At least one slider 113 is positioned near the magnetic disk 112, each slider 113 supporting one or more magnetic head assemblies 121 that include a SOT device. As the magnetic disk 112 rotates, the slider 113 moves radially in and out over the disk surface 122 so that the magnetic head assembly 121 may access different tracks of the magnetic disk 112 where desired data are written. Each slider 113 is attached to an actuator arm 119 by way of a suspension 115. The suspension 115 provides a slight spring force which biases the slider 113 toward the disk surface 122. Each actuator arm 119 is attached to an actuator means 127. The actuator means 127 as shown in FIG. 2 may be a voice coil motor (VCM). The VCM includes a coil movable within a fixed magnetic field, the direction and speed of the coil movements being controlled by the motor current signals supplied by control unit 129.

During operation of the disk drive 100, the rotation of the magnetic disk 112 generates an air bearing between the slider 113 and the disk surface 122 which exerts an upward force or lift on the slider 113. The air bearing thus counterbalances the slight spring force of suspension 115 and supports slider 113 off and slightly above the disk surface 122 by a small, substantially constant spacing during normal operation.

The various components of the disk drive 100 are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads on the assembly 121 by way of recording channel 125.

The above description of a typical magnetic media drive and the accompanying illustration of FIG. 1 are for representation purposes only. It should be apparent that magnetic media drives may contain a large number of media, or disks, and actuators, and each actuator may support a number of sliders. It is to be understood that the embodiments discussed herein are applicable to a data storage device such as a hard disk drive (HDD) as well as a tape drive, such as those conforming to the LTO (Linear Tape Open) standards. As such, any reference in the detailed description to an HDD or tape drive is merely for exemplification purposes and is not intended to limit the disclosure unless explicitly claimed. For example, references to disk media in an HDD embodiment are provided as examples only, and can be substituted with tape media in a tape drive embodiment. Furthermore, reference to or claims directed to magnetic recording devices or data storage devices are intended to include at least both HDD and tape drive unless HDD or tape drive devices are explicitly claimed.

FIG. 2 is a fragmented, cross-sectional side view of certain embodiments of a read/write head 200 having a SOT device. It is noted while an SOT device is shown in both the read head and write head, this is for illustrative purposes only, and an SOT device may be independently integrated into either only the read head or only the write head in various embodiments, or in both the read head and the write head. The read/write head 200 faces a magnetic media 112. The read/write head 200 may correspond to the magnetic head assembly 121 described in FIG. 1. The read/write head 200 includes a media facing surface (MFS) 212, such as a gas bearing surface, facing the disk 112, a write head 210, and a magnetic read head 211. As shown in FIG. 2, the magnetic media 112 moves past the write head 210 in the direction indicated by the arrow 232 and the read/write head 200 moves in the direction indicated by the arrow 234.

In some embodiments, the magnetic read head 211 is a SOT read head that includes an SOT sensing element 204 located between SOT shields S1 and S2. The magnetic fields of the adjacent magnetized regions in the magnetic disk 112 are detectable by the SOT sensing element 204 as the recorded bits. In SOT sensing elements 204 comprising a BiSb layer, current flows perpendicular to the film plane, and the signal is read out by measuring the voltage in the BiSb layer generated by the inverse spin Hall effect. The SOT device of various embodiments can be incorporated into the read head 211.

The write head 210 includes a main pole 220, a leading shield 206, a trailing shield 240, and a coil 218 that excites the main pole 220. The coil 218 may have a "pancake" structure which winds around a back-contact between the main pole 220 and the trailing shield 240, instead of a "helical" structure shown in FIG. 2. In one embodiment, the write head 210 is a perpendicular magnetic recording (PMR) write head. In other embodiments, the write head 210 may use energy assisted magnetic recording (EAMR) technologies such as microwave assisted magnetic recording (MAMR) and heat assisted magnetic recording (HAMR).

In FIG. 2, a spin orbital torque (SOT) device (not shown) may be a part of the write head structure to enable a MAMR recording effect, in one embodiment. As noted above, SOT devices are not required to be implemented in both the read head and/or the write head. The SOT device is formed in a gap between the main pole 220 and the trailing shield 240. The main pole 220 includes a trailing taper 242 and a leading taper 244. The trailing taper 242 extends from a location recessed from the MFS 212 to the MFS 212. The leading taper 244 extends from a location recessed from the MFS 212 to the MFS 212. The trailing taper 242 and the leading taper 244 may have the same degree of taper, and the degree of taper is measured with respect to a longitudinal axis 260 of the main pole 220. In some embodiments, the main pole 220 does not include the trailing taper 242 and the leading taper 244. Instead, the main pole 220 includes a trailing side (not shown) and a leading side (not shown), and the trailing side and the leading side are substantially parallel. The main pole 220 may be a magnetic material, such as a FeCo alloy. The leading shield 206 and the trailing shield 240 may be a magnetic material, such as a NiFe alloy. In certain embodiments, the trailing shield 240 can include a trailing shield hot seed layer 241. The trailing shield hot seed layer 241 can include a high moment sputter material, such as CoFeN or FeXN, where X includes at least one of Rh, Al, Ta, Zr, and Ti. In certain embodiments, the trailing shield 240 does not include a trailing shield hot seed layer.

In some embodiments, the read head 211 is a spin torque oscillator (STO) read head with an STO oscillator sensing element 204 located between shields S1 and S2. The magnetic fields of the adjacent magnetized regions in the magnetic disk 112 are detectable by the STO sensing element 204 as the recorded bits. The STO sensing elements 204 comprise a BiSb layer, such as an SOT device of FIGS. 4A-4F. The STO reader may be operated in a 2-terminal or a 3-terminal configuration, with an in-plane current flowing inside SOT structure while a small sensing current flows perpendicular to the film plane, and the signal is read out by measuring the frequency of magnetic layer precession. The SOT device of various embodiments can be incorporated into the read head 211.

Figure 3A:
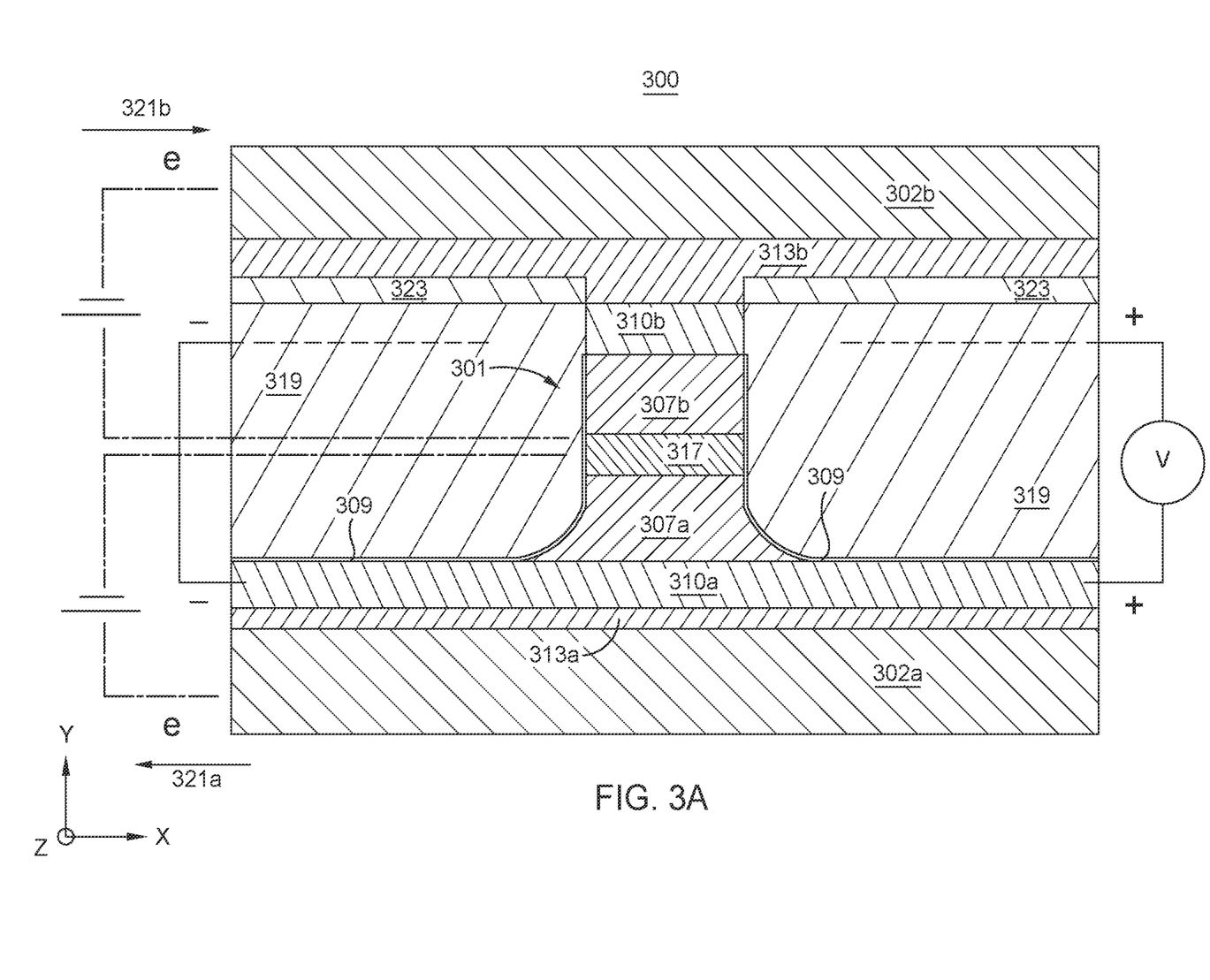
FIGS. 3A-3C illustrate MFS views of read heads comprising an SOT device, according to various embodiments.
Figure 3B:
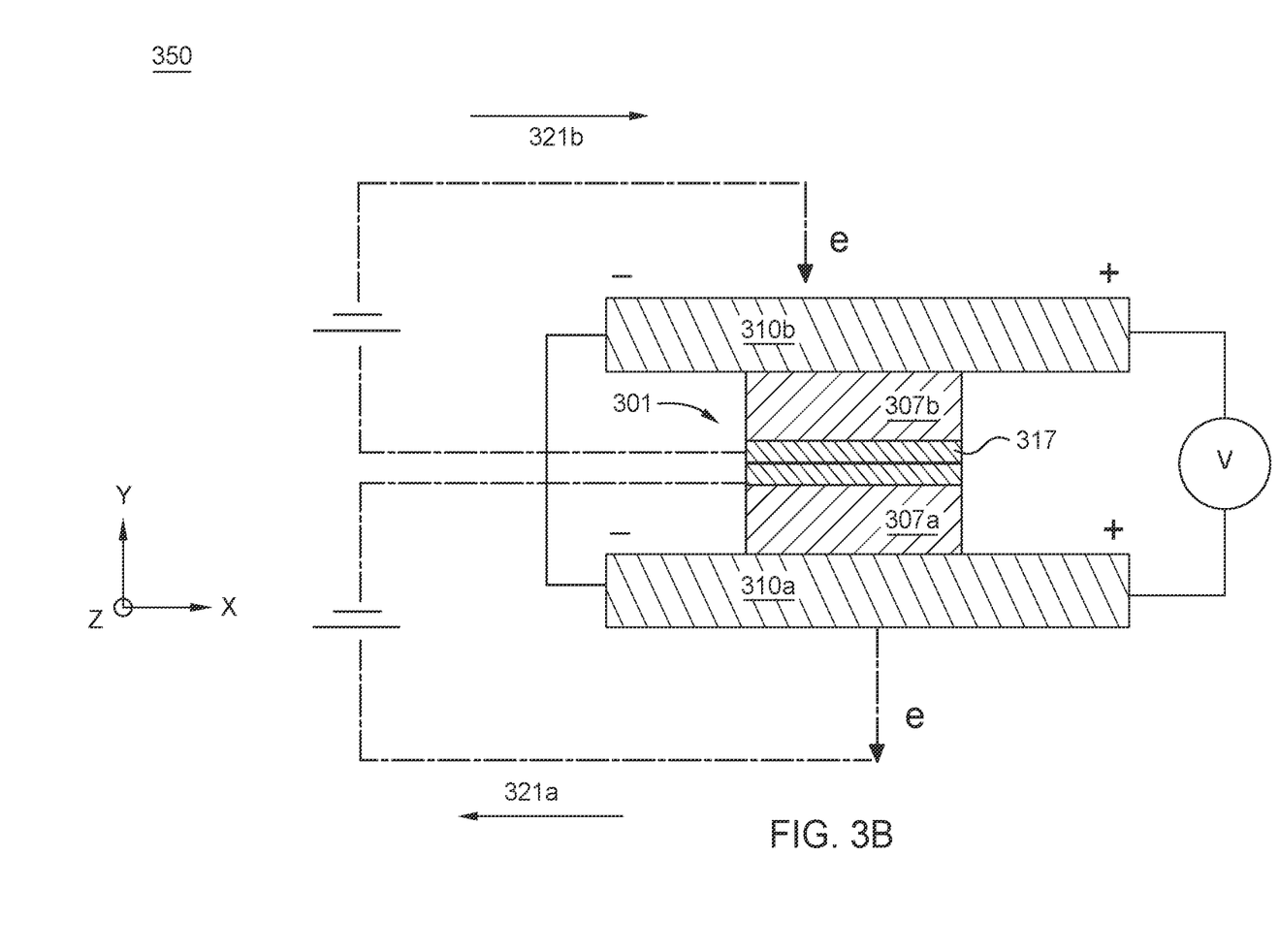
Figure 3C:
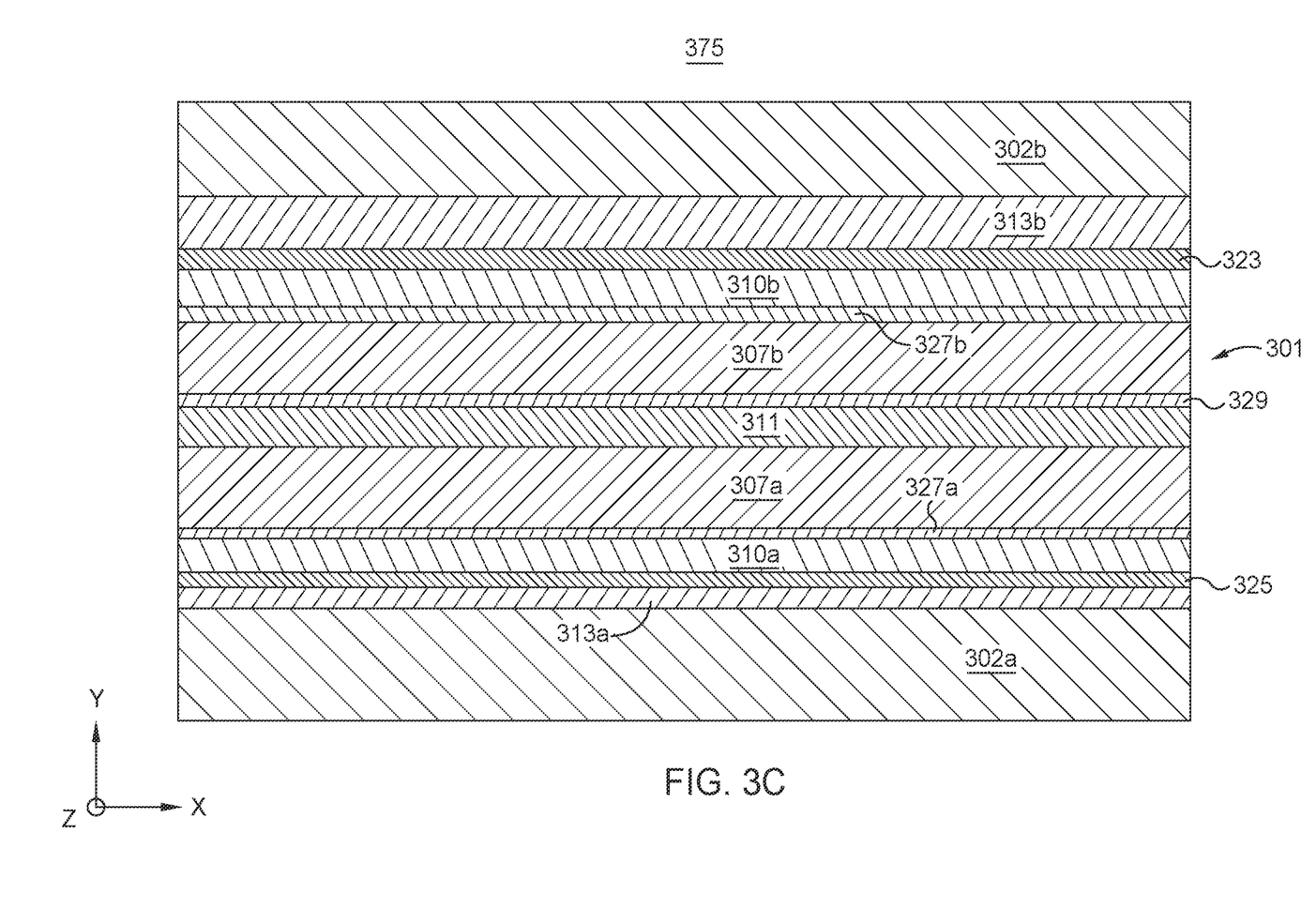

FIGS. 3A-3C illustrate MFS views of read heads 300, 350, 375, respectively, comprising an SOT device 301, according to various embodiments. The read heads 300, 350, 375 may be the read head 211 of FIG. 2. Each read head 300, 350, 375 comprises a SOT device 301 having dual free layers 307a, 307b, and each read head 300, 350, 375 may be referred to as a differential reader. Portions of each read head 300, 350, 375 may be formed as discussed below in FIGS. 4A-4D.

The read head 300 of FIG. 3A comprises a first shield 302a, a first layer 313a disposed on the first shield 302a, a first spin Hall effect layer (SHL) 310a disposed on the first layer 313a, a first free layer (FL) 307a disposed on the first SHL 310a, a gap layer 317 disposed on the first FL 307a, a second FL 307b disposed on the gap layer 317, a second SHL 310b disposed on the second FL 307b, a second layer 313b disposed on the second SHL 310b, and a second shield 302b disposed on the second layer 313b. The first and second SHLs 310a, 310b may be referred to as topological insulators. The first and second FLs 307a, 307b may each individually comprise CoFeB, Co, CoFe, or NiFe. The first and second shields 302a, 302b may each individually comprise a magnetic material, such as NiFe.

The first and second layers 313a, 313b may each individually be an insulation layer or a seed layer, which may comprise SiN, NiFeGe, Ru, Pt, RuAl, or an amorphous oxide, as discussed below in FIGS. 4A-4D. In some embodiments, the first and second layers 313a, 313b comprise different materials. The first and second layers 313a, 313b are selected based upon the crystalline orientation of BiSb of the SHL layer is desired. For example, the first layer 313a and the second layer 313b may each individually comprise one or more materials selected from the group consisting of: a covalently bonded amorphous material, a tetragonal (001) material, a tetragonal (110) material, a body-centered cubic (bcc) (100) material, a face-centered cubic (fcc) (100) material, a textured bcc (100) material, a textured fcc (100) material, a textured (100) material, an amorphous metallic material, and a layered combination of one or more of any of the preceding materials in order to grow the BiSb of the first SHL 310a in a (012) orientation and/or in order to grow the BiSb of the second SHL 310b in a (001) orientation. In another example, the first layer 313a and the second layer 313b may each individually comprise a low atomic number (Z) oxide or nitride like MgO, SiN; or amorphous transition metal layers like NiFeGe or CoFeB.

The first and second SHLs 310a, 310b may each individually comprise bismuth antimony (BiSb). In one embodiment, the first SHL 310a comprises BiSb having a (012) orientation, and the second SHL 310b comprises BiSb having a (001) orientation. In another embodiment, the first SHL 310a comprises BiSb having a (001) orientation, and the second SHL 310b comprises BiSb having a (012) orientation.

Side shields 319 are disposed adjacent to the SOT device 301 in the x-direction. The side shields 319 may comprise a magnetic material, such as NiFe. An insulation layer 309 is disposed on the first SHL 310a and between the SOT device 301 and the side shields 319. The insulation layer 309 may comprise SiN or NiFeGe. The second SHL 310b is disposed in contact with the side shields 319. An antiferromagnetic cap layer 323 is disposed between the side shields 319 and the second layer 313b. The first and second shields 302a, 302b, the first SHL 310a, and the first and second layers 313a, 313b may each individually have a greater length in the x-direction than the first and second FLs 307a, 307b, the gap layer 317, and the second SHL 310b. A first current 321a flows from the first shield 302a into the gap layer 317, and a second current 321b flows from the gap layer 317 into the second shield 302b. A voltage may be applied to the first and second SHLs 310a, 310b.

The read head 350 of FIG. 3B is similar to the read head 300 of FIG. 3A; however, the read head 350 does not comprise the first and second layers, insulation layers, or shields. In the read head 350, the first FL 307a is disposed on the first SHL 310a, the gap layer 317 is disposed on the first FL 307a, the second FL 307b is disposed on the gap layer 317, and the second SHL 310b is disposed on the second FL 307b. The first and second SHLs 310a, 310b have a greater length in the x-direction than the first and second FLs 307a, 307b and the gap layer 317. In one embodiment, the first SHL 310a comprises BiSb having a (012) orientation, and the second SHL 310b comprises BiSb having a (001) orientation. In another embodiment, the first SHL 310a comprises BiSb having a (001) orientation, and the second SHL 310b comprises BiSb having a (012) orientation. A first current 321a flows from the first SHL 310a into the gap layer 317, and a second current 321b flows from the gap layer 317 into the second SHL 310b. A voltage may be applied to the first and second SHLs 310a, 310b.

In some embodiments, the first and second SHLs 310a, 310b are grown on sacrificial layers (not shown) that comprise different materials. The sacrificial layers are selected based upon the crystalline orientation of BiSb of the SHL layer is desired. For example, a sacrificial layer disposed in contact with the first SHL 310a and a second sacrificial layer disposed in contact with the second SHL 310b may each individually comprise one or more materials selected from the group consisting of: a covalently bonded amorphous material, a tetragonal (001) material, a tetragonal (110) material, a body-centered cubic (bcc) (100) material, a face-centered cubic (fcc) (100) material, a textured bcc (100) material, a textured fcc (100) material, a textured (100) material, an amorphous metallic material, and a layered combination of one or more of any of the preceding materials in order to grow the BiSb of the first SHL 310a in a (012) orientation and/or in order to grow the BiSb of the second SHL 310b in a (001) orientation. In another example, a sacrificial layer disposed in contact with the first SHL 310a and a second sacrificial layer disposed in contact with the second SHL 310b may each individually comprise a low atomic number (Z) oxide or nitride like MgO, SiN; or low Z metals like Mg or Ti; or easily etched materials like Cu alloys; or amorphous transition metal layers like NiFeGe or CoFeB.

The read head 375 of FIG. 3C is similar to the read head 300 of FIG. 3A; however, the read head 375 further comprises seed layers 325, 329 and interlayers 327a, 327b. The read head 375 comprises the first shield 302a, the insulation layer 313a disposed on the first shield 302a, a first seed layer 325 disposed on the first layer 313a, the first SHL 310a disposed on the first seed layer 325, a first interlayer 327a disposed on the first SHL 310a, the first FL 307a disposed on the first interlayer 327a, a gap layer 311 disposed on the first FL 307a, a second seed layer 329 disposed on the gap layer 311, the second FL 307b disposed on the second seed layer 329, a second interlayer 327b disposed on the second FL 307b, the second SHL 310b disposed on the second interlayer 327b, a cap layer 323 disposed on the second SHL 310b, the second layer 313b disposed on the cap layer 323, and a second shield 302b disposed on the second layer 313b. Each layer of the read head 375 has a same length in the x-direction. The first and second layers 313a, 313b may each individually be an insulation layer comprising SiN or NiFeGe.

The cap layer 323 comprises a material selected from the group consisting of SiN, TiN, $Al_2O_3$, $SiO_2$, NiFeTa, NiTa, NiW, NiFeW, CoHf, CoFeHf, Pt, Co, Cu, Ni, NiCu, CoCu, Ru, Ta, Cr, Au, Rh, other non-magnetic materials, and combinations thereof. The first seed layer 325, the second seed layer 329, the first interlayer 327a, and the second interlayer 327b may each individually comprise an amorphous oxide, as discussed below in FIGS. 4A-4D.

One or more of the first seed layer 325, the second seed layer 329, the first interlayer 327a, and the second interlayer 327b may comprise different materials. For example, at least the first seed layer 325 and the second interlayer 327b may comprise different materials, as the material of the first seed layer 325 and the material of the second interlayer 327b are selected based upon the crystalline orientation of BiSb of the SHL layer is desired. For example, the first seed layer 325 may comprise SiN, NiFeGe, Ru, RuAl, or Pt in order to grow the BiSb of the first SHL 310a in a (012) orientation while the second interlayer 327b may comprise amorphous oxide in order to grow the BiSb of the second SHL 310b in a (001) orientation.

In one embodiment, the first SHL 310a comprises BiSb having a (012) orientation, and the second SHL 310b comprises BiSb having a (001) orientation. In another embodiment, the first SHL 310a comprises BiSb having a (001) orientation, and the second SHL 310b comprises BiSb having a (012) orientation.

Each of the SOT devices 301 of the read heads 300, 350, 375 utilizes a first SHL 310a comprising (012) BiSb and a second SHL 310b comprising (001) BiSb, or vice versa, which balances and optimizes the signal through the SOT devices 301 of the read heads 300, 350, 375 by matching the signal on the top (i.e., the second SHL 310b) and bottom (i.e., the first SHL 310a) of the SOT devices 301 of the read heads 300, 350, 375. Methods of growing or forming SHLs having a (012) orientation are further described in U.S. patent application Ser. No. 17/401,856, filed Aug. 13, 2021, and titled "Buffer Layers And Interlayers That Promote BiSbx (012) Alloy Orientation For SOT And MRAM Devices," which is herein incorporated by reference. Additionally, the various SOT devices described may be used in magnetic sensor applications outside of a read sensor/reader in magnetic recording, and such sensors may be similarly fabricated as the various reader/read head stacks shown or described.

FIGS. 4A-4D illustrate a method of forming a SHL 410 comprising BiSb having a (001) orientation to be utilized in an SOT device, according to one embodiment. The SHL 410 may be the first SHL 310a and/or the second SHL 310b of FIGS. 3A-3C. The SHL 410 may be utilized with any of the SOT devices 301 and/or the read heads 300, 350, 375 of FIGS. 3A-3C.

Figure 4A:
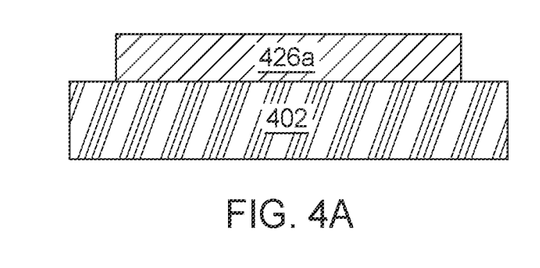
FIGS. 4A-4D illustrate a method of forming a spin Hall effect layer (SHL) comprising BiSb having a (001) orientation, according to one embodiment.

In FIG. 4A, an amorphous material layer 426a is deposited on a shield (e.g., in the case of an SOT-based magnetic recording reader) or substrate 402 (both can be referenced generically as substrate). The amorphous material is capable of forming an oxide, has a low atomic number, and a high binding energy or high free energy of formation. The amorphous material may be one of B, Al, Si, SiN, Mg, Ti, Sc, V, Cr, Mn, Y, Zr, Nb, AlN, C, Ge, or combinations thereof. The substrate 402 may comprise Si, $SiO_2$, or a combination thereof.

Figure 4B:
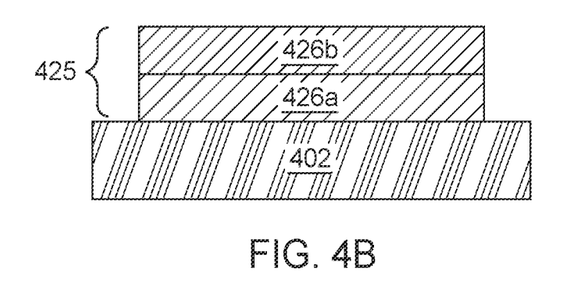

In FIG. 4B, the amorphous material layer 426a is exposed to air for natural oxidation, which forms an amorphous oxide surface 426b on the amorphous material layer 426a. The amorphous material layer 426a and the amorphous oxide surface 426b collectively form a seed layer 425. The seed layer 425 may be an interlayer or a buffer layer. In some embodiments, the entire amorphous material layer 426a is formed into amorphous oxide. The amorphous oxide surface 426b has a local hexagonal symmetry. The amorphous oxide surface 426b may have a thickness in the y-direction of about 5 Å to about 15 Å. When the amorphous material is exposed to air, the amorphous material 426a oxidizes or hydrolyzes, causing at least the surface of the amorphous material to form oxides or hydroxides. The amorphous oxide 426b may be one of $B_2O$, $Al_2O_3$, $SiO_2$, SiNO, MgO, $TiO_2$, $Sc_2O_3$, $V_2O_5$, $Cr_2O_3$, $MnO_2$, $Y_2O_3$, $ZrO_2$, $NbO_2$, AlNO, CO, $GeO_2$, or combinations thereof. The seed layer 425 may have a thickness in the y-direction of about 5 Å to about 20 Å.

Figure 4C:
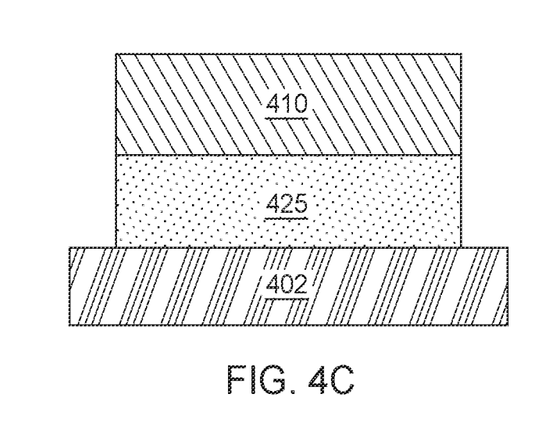

In FIG. 4C, the SHL 410 comprising BiSb is deposited on the amorphous oxide surface 426b of the seed layer 425. The amorphous oxide surface 426b of the seed layer 425 promotes the BiSb of the SHL 410 to grow having a (001) orientation, as the oxides and/or hydroxides on at least the amorphous oxide surface 426b have a hexagonal basal plane. The SHL 410 may have a thickness in the y-direction of about 5 nm to about 15 nm, such as about 10 nm. The SHL 410 comprising (001) BiSb is able to achieve a high spin hall angle (SHA), such as a SHA between about 8 and about 9, such as about 8.8.

Figure 4D:
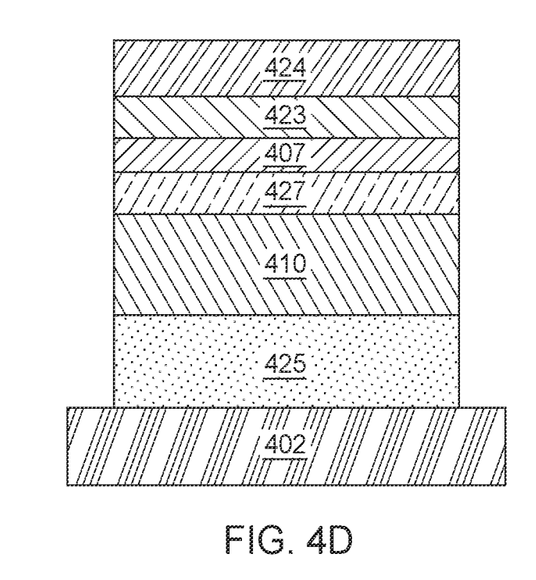

In FIG. 4D, an interlayer 427 is deposited on the SHL 410, a ferromagnetic (FM) or free layer 407 is deposited on the interlayer 427, a first cap layer 423 is deposited on the FM layer 407, and a second cap layer 424 is deposited on the first cap layer 423. In addition to the materials referred to in FIGS. 3A-3C, the interlayer 427 may comprise NiTaN, the FM layer 407 may comprise CoFeB, the first cap layer 423 may comprise NiTa, and the second cap layer 424 may comprise NiCr, for example.

Figure 5:
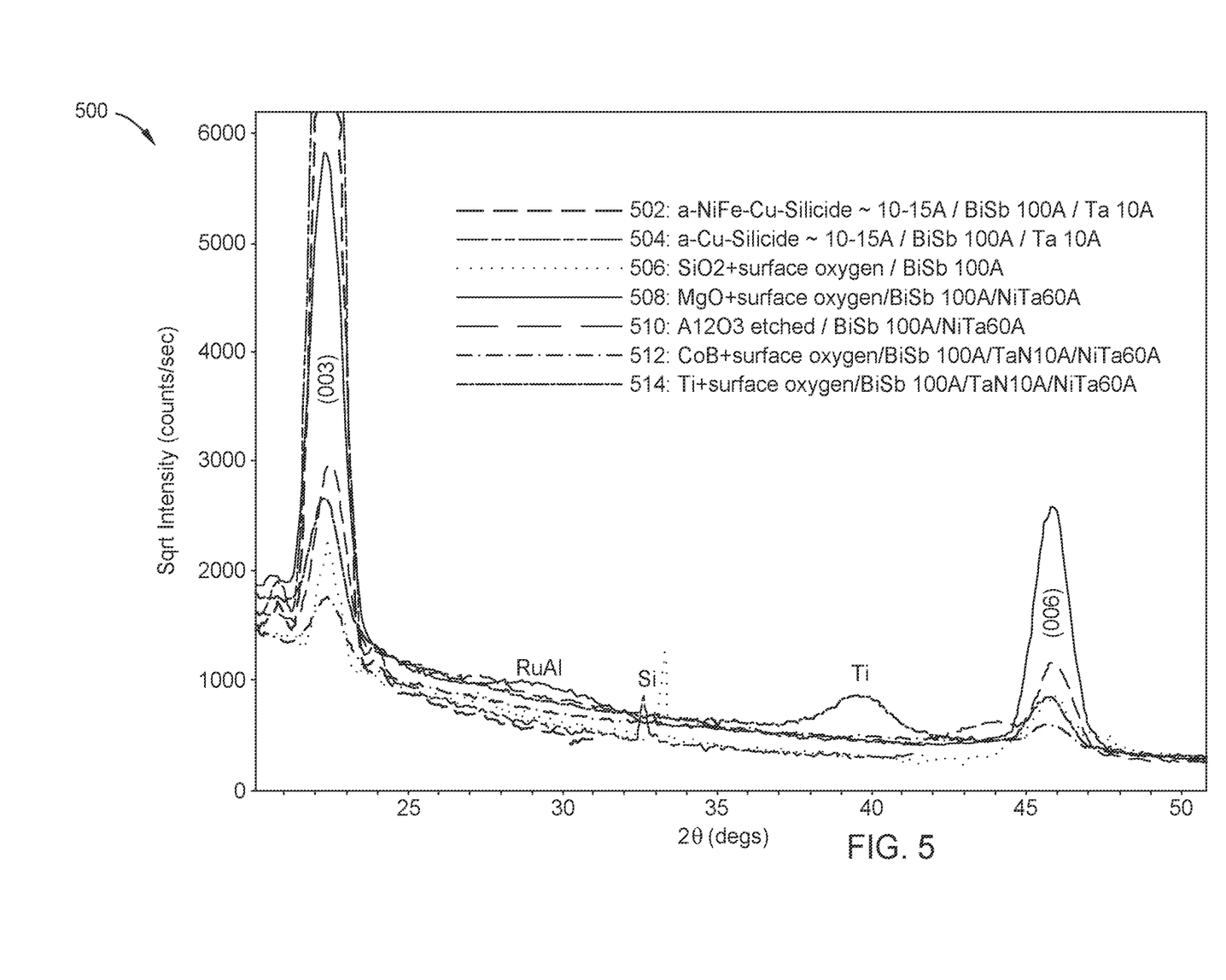
FIG. 5 illustrates a graph showing the crystalline orientation of a SHL comprising BiSb for portions of various SOTs, according to various embodiments.

FIG. 5 illustrates a graph 500 showing the crystalline orientation of a SHL comprising BiSb for portions of various SOTs, according to various embodiments. The graph 500 shows a square root of intensity in counts/sec versus degrees (2θ). The various seed layers, interlayers, buffer layers, and/or cap layers, as well as their respective thicknesses, for the portions of SOTs shown by lines 502-514 in the graph 500 may be utilized in the SOTs 300, 350, 375 of FIGS. 3A-3C. Moreover, the portions of SOTs shown by lines 502-514 in the graph 500 may be formed using the method discussed in FIGS. 4A-4D.

Line 502 represents an SOT comprising an interlayer or seed layer of NiFe—Cu-Silicide having a thickness of about 10 Å to about 15 Å, a BiSb layer (or SHL) disposed on the seed layer having a thickness of about 100 Å, and an interlayer of Ta disposed on the BiSb layer having a thickness of about 10 Å. Line 504 represents an SOT comprising an interlayer or seed layer of Cu-Silicide having a thickness of about 10 Å to about 15 Å, a BiSb layer (or SHL) disposed on the seed layer having a thickness of about 100 Å, and an interlayer of Ta disposed on the BiSb layer having a thickness of about 10 Å. Line 506 represents an SOT comprising an interlayer or seed layer of $SiO_2$ with surface oxygen having a thickness of about 5 Å to about 15 Å, and a BiSb layer (or SHL) disposed on the seed layer having a thickness of about 100 Å. Line 508 represents an SOT comprising an interlayer or seed layer of MgO with surface oxygen having a thickness of about 5 Å to about 15 Å, a BiSb layer (or SHL) disposed on the seed layer having a thickness of about 100 Å, and an interlayer of NiTa disposed on the BiSb layer having a thickness of about 60 Å.

Line 510 represents an SOT comprising an interlayer or seed layer of etched $Al_2O_3$ having a thickness of about 5 Å to about 15 Å, a BiSb layer (or SHL) disposed on the seed layer having a thickness of about 100 Å, and an interlayer of NiTa disposed on the BiSb layer having a thickness of about 60 Å. Line 512 represents an SOT comprising an interlayer or seed layer of CoB with surface oxygen having a thickness of about 15 Å to about 20 Å, a BiSb layer (or SHL) disposed on the seed layer having a thickness of about 100 Å, an interlayer of TaN disposed on the BiSb layer having a thickness of about 10 Å, and a cap layer of NiTa disposed on the interlayer having a thickness of about 60 Å. Line 514 represents an SOT comprising an interlayer or seed layer of $TiO_2$ with surface oxygen having a thickness of about 5 Å to about 15 Å, a BiSb layer (or SHL) disposed on the seed layer having a thickness of about 100 Å, an interlayer of TaN disposed on the BiSb layer having a thickness of about 10 Å, and a cap layer of NiTa disposed on the interlayer having a thickness of about 60 Å.

As shown in the graph 500, each of lines 502-514 form a strong (003) peak at an intensity of about 1500 counts/sec to about 6500 counts/sec at around 10 degrees to about 15 degrees, indicating each of the seed layers used in the SOTs represented by lines 502-514 promoted the BiSb layer to have a (001) orientation.

Figure 6A:
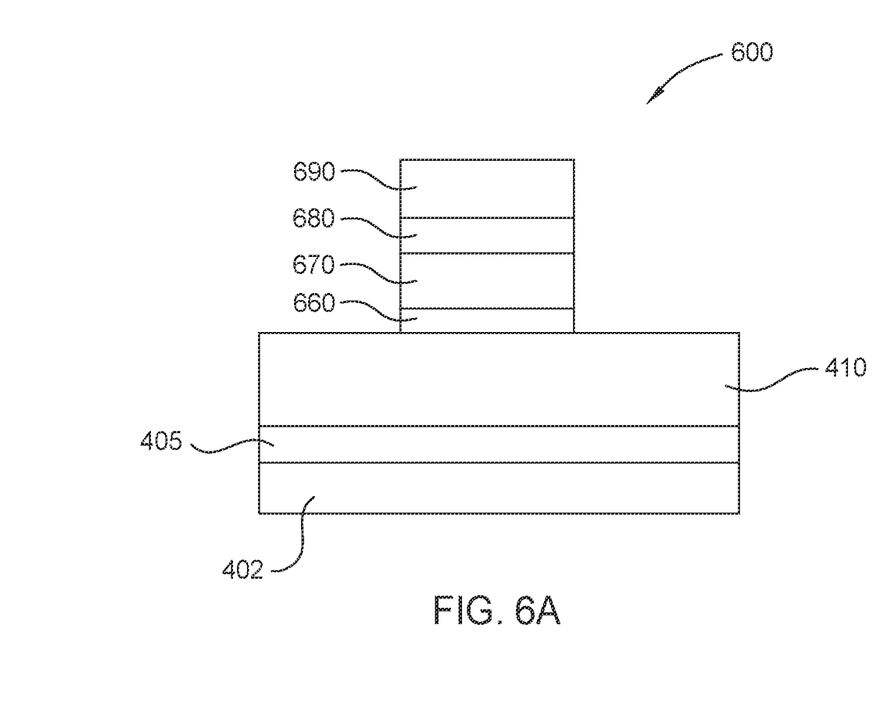
FIG. 6A is a schematic cross-sectional view of a SOT device for use in a MAMR write head, such as in the magnetic recording head of the drive of FIG. 1 or other suitable magnetic media drives.

FIG. 6A is a schematic cross-sectional view of a SOT device 600 for use in a MAMR write head, such as a MAMR write head that can be used as part of the magnetic recording head of the drive 100 of FIG. 1 or other suitable magnetic media drives. The SOT device 600 comprises a BiSb layer 410 with a (012) orientation, or alternatively, a BiSb layer 410 with a (001) orientation, formed over a buffer layer 405 formed over a shield or substrate 402, such as the BiSb layer 410 of FIGS. 4C-4D. The buffer layer 405 may be the interlayer or seed layer 425 of FIGS. 4BA-4D. A spin torque layer (STL) 670 is formed over the BiSb layer 410. The STL 670 comprises a ferromagnetic material such as one or more layers of CoFe, CoIr, NiFe, and CoFeX alloy wherein X=B, Ta, Re, or Ir. The STL 670 may be a free layer, such as the free layers 307a, 307b of FIGS. 3A-3C. As such, the STL 670 may be referred to as a free layer.

In certain embodiments, an electrical current shunt block layer 660 is disposed between the BiSb layer 410 and the STL 670. The electrical current shunt blocking layer 660 reduces electrical current from flowing from the BiSb layer 410 to the STL 670 but allows spin orbital coupling of the BiSb layer 410 and the STL 670. In certain embodiments, the electrical current shunt blocking layer 660 comprises a magnetic material which provides greater spin orbital coupling between the BiSb layer 410 and the STL 670 than a non-magnetic material. In certain embodiments, the electrical current shunt blocking layer 660 comprises a magnetic material of FeCo, FeCoM, FeCoMO, FeCoMMeO, FeCoM/MeO stack, FeCoMNiMnMgZnFeO, FeCoM/NiMnMgZnFeO stack, multiple layers/stacks thereof, or combinations thereof in which M is one or more of B, Si, P, Al, Hf, Zr, Nb, Ti, Ta, Mo, Mg, Y, Cu, Cr, and Ni, and Me is Si, Al, Hf, Zr, Nb, Ti, Ta, Mg, Y, or Cr. In certain embodiments, the electrical current shunt blocking layer 660 is formed to a thickness from about 10 Å to about 100 Å. In certain aspects, an electrical current shunt blocking layer 660 having a thickness of over 100 Å may reduce spin orbital coupling of the BiSb layer 410 and the STL 670. In certain aspects, an electrical current shunt blocking layer having a thickness of less than 10 Å may not sufficiently reduce electrical current from BiSb layer 410 to the STL 670.

In certain embodiments, additional layers are formed over the STL 670 such as a spacer layer 680 and a pinning layer 690. The pinning layer 690 can partially pin the STL 670. The pinning layer 690 comprises a single or multiple layers of PtMn, NiMn, IrMn, IrMnCr, CrMnPt, FeMn, other antiferromagnetic materials, or combinations thereof. The spacer layer 680 comprises single or multiple layers of magnesium oxide, aluminum oxide, other non-magnetic materials, or combinations thereof.

Figure 6B:
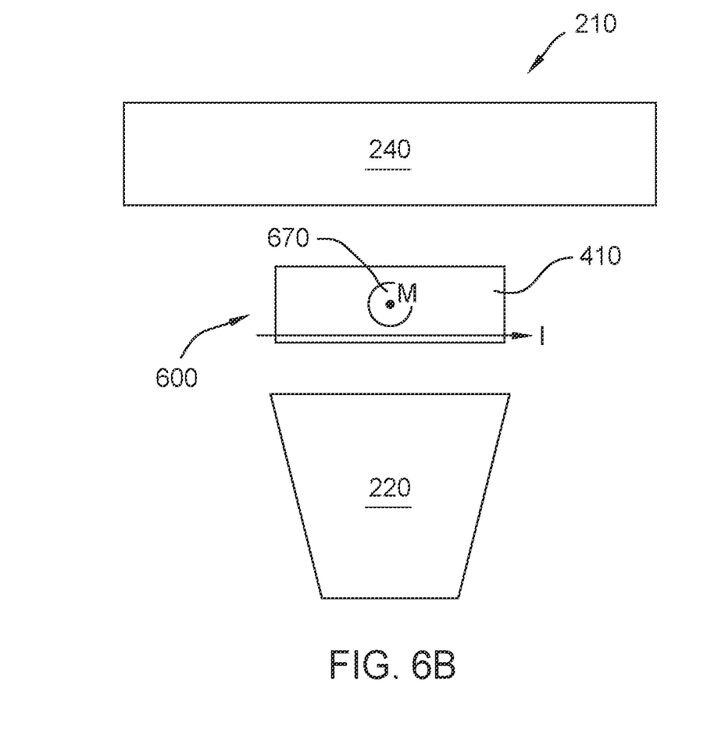
FIGS. 6B-6C are schematic MFS views of certain embodiments of a portion of a MAMR write head with a SOT device of FIG. 6A.
Figure 6C:
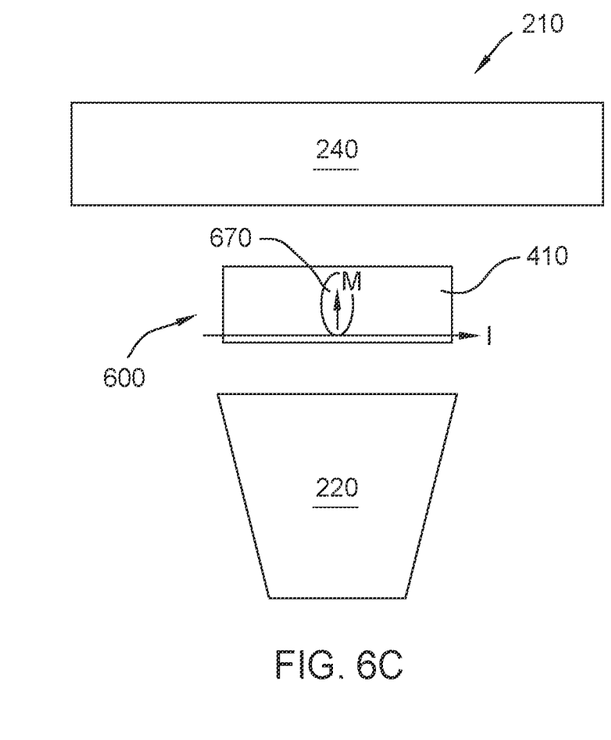

FIGS. 6B-6C are schematic MFS views of certain embodiments of a portion of a MAMR write head 210 with a SOT device 600 of FIG. 6A. The MAMR write head 210 can be the write head in FIG. 2 or other suitable write heads usable in the drive 100 of FIG. 1 or other suitable magnetic media drives such as tape drives. The MAMR write head 210 includes a main pole 220 and a trailing shield 240 in a down-track direction. The SOT device 600 is disposed in a gap between the main pole 220 and the trailing shield 240.

During operation, charge current through a BiSb layer or layer stack 410 acting as a spin Hall layer generates a spin current in the BiSb layer. The spin orbital coupling of the BiSb layer and a spin torque layer (STL) 670 causes switching or precession of magnetization of the STL 670 by the spin orbital coupling of the spin current from the BiSb layer 410. Switching or precession of the magnetization of the STL 670 can generate an assisting AC field to the write field. Energy assisted write heads based on SOT have multiple times greater power efficiency in comparison to MAMR write heads based on spin transfer torque. As shown in FIG. 6B, an easy axis of a magnetization direction of the STL 770 is perpendicular to the MFS from shape anisotropy of the STL 670, from the pinning layer 690 of FIG. 6A, and/or from hard bias elements proximate the STL 670. As shown in FIG. 6C, an easy axis of a magnetization direction of the STL 670 is parallel to the MFS from shape anisotropy of the STL 670, from the pinning layer 690 of FIG. 6A, and/or from hard bias elements proximate the STL 670.

Figure 7:
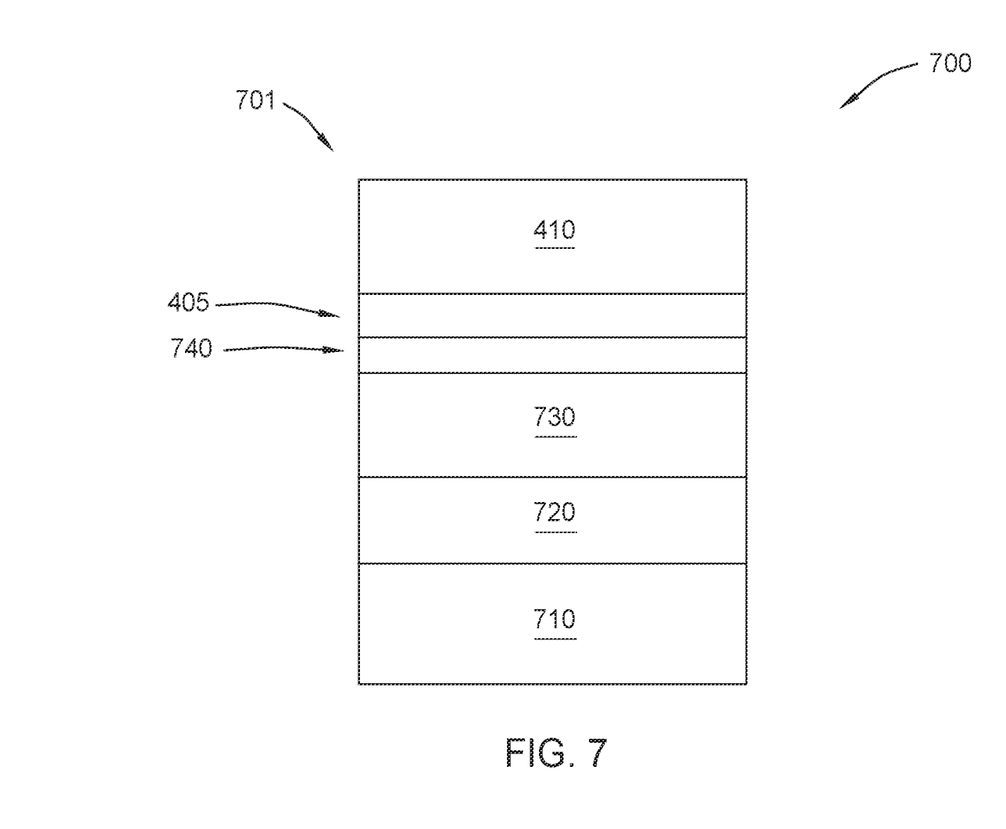
FIG. 7 is a schematic cross-sectional view of a SOT used as a MRAM device.

FIG. 7 is a schematic cross-sectional view of a SOT magnetic tunnel junction (MTJ) 701 used as a MRAM device 700. The MRAM device 700 comprises a reference layer (RL) 710, a spacer layer 720 over the RL 710, a recording layer 730 over the spacer layer 720, a buffer layer 405 over an electrical current shunt block layer 740 over the recording layer 730, and a BiSb layer or layer stack 410 over the buffer layer 405. The BiSb layer 410 may be the BiSb layer 410 of FIGS. 4C-4D, and the buffer layer 405 may be the interlayer or seed layer 425 of FIGS. 4B-4D. The BiSb layer 410 may be a doped BiSb layer having a (012) orientation or a BiSb layer having a (001) orientation. The RL 710 may be a free layer, such as the free layer 307a, 307b of FIGS. 3A-3C. As such, the RL 710 may be referred to as a free layer.

The RL 710 comprises single or multiple layers of CoFe, other ferromagnetic materials, and combinations thereof. The spacer layer 720 comprises single or multiple layers of magnesium oxide, aluminum oxide, other dielectric materials, or combinations thereof. The recording layer 730 comprises single or multiple layers of CoFe, NiFe, other ferromagnetic materials, or combinations thereof.

As noted above, in certain embodiments, the electrical current shunt block layer 740 is disposed between the buffer layer 405 and the recording layer 730. The electrical current shunt blocking layer 740 reduces electrical current from flowing from the BiSb layer 410 to the recording layer 730 but allows spin orbital coupling of the BiSb layer 410 and the recording layer 730. For example, writing to the MRAM device can be enabled by the spin orbital coupling of the BiSb layer and the recording layer 730, which enables switching of magnetization of the recording layer 730 by the spin orbital coupling of the spin current from the BiSb layer 410. In certain embodiments, the electrical current shunt blocking layer 740 comprises a magnetic material which provides greater spin orbital coupling between the BiSb layer 410 and the recording layer 730 than a non-magnetic material. In certain embodiments, the electrical current shunt blocking layer 740 comprises a magnetic material of FeCoM, FeCoMO, FeCoMMeO, FeCoM/MeO stack, FeCoMNiMnMgZnFeO, FeCoM/NiMnMgZnFeO stack, multiple layers/stacks thereof, or combinations thereof, in which M is one or more of B, Si, P, Al, Hf, Zr, Nb, Ti, Ta, Mo, Mg, Y, Cu, Cr, and Ni, and Me is Si, Al, Hf, Zr, Nb, Ti, Ta, Mg, Y, or Cr.

The MRAM device 700 of FIG. 7 may include other layers, such as pinning layers, pinning structures (e.g., a synthetic antiferromagnetic (SAF) pinned structure), electrodes, gates, and other structures. Other MRAM devices besides the structure of FIG. 7 can be formed utilizing a BiSb layer 410 with a (012) orientation, or alternatively, a BiSb layer 410 with a (001) orientation, over a buffer layer 405 to form a SOT MTJ 701.

Thus, by utilizing a first SHL comprising (012) BiSb and a second SHL comprising (001) BiSb in an SOT device, the signal through the SOT device is balanced, as the signal is optimized to match through both the first and second SHLs. Furthermore, SOT devices comprising a (012) BiSb layer and a (001) BiSb layer are able to achieve high spin hall angles, increasing the overall performance of the SOT devices.

In one embodiment, a method of forming a spin-orbit torque (SOT) device, the method comprises comprises depositing an amorphous material on a substrate, the amorphous material being selected from the group consisting of: B, Al, Si, SiN, Mg, Ti, Sc, V, Cr, Mn, Y, Zr, Nb, AlN, C, Ge, and combinations thereof, exposing the amorphous material to air to form an amorphous material oxide surface on the amorphous material, and depositing a first BiSb layer on the amorphous material oxide surface, the first BiSb layer having a (001) orientation.

The amorphous material oxide surface has a thickness of about 5 Å to about 15 Å. The method further comprises depositing an interlayer on the first BiSb layer, depositing a first ferromagnetic layer on the interlayer, and depositing a cap layer on the first ferromagnetic layer. The method further comprises depositing a second ferromagnetic layer over the cap layer, and depositing a second BiSb layer over the second ferromagnetic layer, the second BiSb layer having a (012) orientation. A magnetic recording head comprising the SOT device formed by the method. A magnetic recording device comprising the magnetic recording head. A magneto-resistive memory comprising the SOT device formed by the method. A magnetic sensor comprising the SOT device formed by the method.

In another embodiment, a spin-orbit torque (SOT) device comprises a first spin Hall effect layer comprising BiSb having a (012) orientation, a first free layer disposed over the first spin Hall effect layer, a second free layer disposed over the first free layer, and a second spin Hall effect layer disposed over the second free layer, the second spin Hall effect layer comprising BiSb having a (001) orientation.

The SOT device further comprises a first interlayer disposed in contact with the first spin Hall effect layer, and a second interlayer disposed in contact with the second spin Hall effect layer, the second interlayer comprising an amorphous oxide material, wherein the first interlayer and the second interlayer comprise different materials. The amorphous oxide material comprises an amorphous material selected from the group consisting of: B, Al, Si, SiN, Mg, Ti, Sc, V, Cr, Mn, Y, Zr, Nb, AlN, C, Ge, and combinations thereof. The first interlayer comprising SiN, NiFeGe, Ru, RuAl, or Pt. The second interlayer has a thickness of about 5 Å to about 15 Å. The first spin Hall effect layer has a greater width than the first free layer and the second free layer. The SOT device further comprises a gap layer disposed between the first free layer and the second free layer. A magnetic recording head comprising the SOT device. A magnetic recording device comprising the magnetic recording head. A magnetic sensor comprising the SOT device.

In yet another embodiment, a spin-orbit torque (SOT) device comprises a first shield, a first interlayer disposed on the first shield, a first spin Hall effect layer disposed on the first interlayer, the first spin Hall effect layer comprising BiSb having a (012) orientation, a first free layer disposed over the first spin Hall effect layer, a gap layer disposed on the first free layer, a second free layer disposed over the gap layer, a second interlayer disposed over the second free layer, the second interlayer comprising an amorphous oxide material, wherein the first interlayer and the second interlayer comprise different materials, a second spin Hall effect layer disposed on the second interlayer, the second spin Hall effect layer comprising BiSb having a (001) orientation, and a second shield disposed over the second spin Hall effect layer.

The second interlayer has a thickness of about 5 Å to about 15 Å. The amorphous oxide material comprises an amorphous material selected from the group consisting of: B, Al, Si, SiN, Mg, Ti, Sc, V, Cr, Mn, Y, Zr, Nb, AlN, C, Ge, and combinations thereof. The first interlayer comprises SiN, NiFeGe, Ru, RuAl, or Pt. The first spin Hall effect layer has a greater width than the second first spin Hall effect. The first spin Hall effect layer and the second spin Hall effect layer have a same width. A magnetic recording head comprising the SOT device. A magnetic recording device comprising the magnetic recording head. A magneto-resistive memory comprising the SOT device.

In yet another embodiment, a spin-orbit torque (SOT) device comprises a substrate, an amorphous material oxide layer disposed over the substrate, a spin Hall effect layer disposed in contact with the amorphous material oxide layer, the spin Hall effect layer comprising BiSb having a (001) orientation, and a free layer disposed over the spin Hall effect layer.

The amorphous material oxide layer comprises an oxidized form of an amorphous material selected from the group consisting of: B, Al, Si, SiN, Mg, Ti, Sc, V, Cr, Mn, Y, Zr, Nb, AlN, C, Ge, and combinations thereof. A magnetic sensor comprising the SOT device. A magneto-resistive memory comprising the SOT device. A magnetic recording head comprising the SOT device. A magnetic recording device comprising the magnetic recording head.

While the foregoing is directed to embodiments of the present disclosure, other and further embodiments of the disclosure may be devised without departing from the basic scope thereof, and the scope thereof is determined by the claims that follow.

What is claimed is:

1. A spin-orbit torque (SOT) device, comprising:
   a first spin Hall effect layer comprising BiSb having a (012) orientation;
   a first free layer disposed over the first spin Hall effect layer;
   a second free layer disposed over the first free layer; and
   a second spin Hall effect layer disposed over the second free layer, the second spin Hall effect layer comprising BiSb having a (001) orientation.

2. The SOT device of claim 1, further comprising:
   a first interlayer disposed in contact with the first spin Hall effect layer; and
   a second interlayer disposed in contact with the second spin Hall effect layer, the second interlayer comprising an amorphous oxide material, wherein the first interlayer and the second interlayer comprise different materials.

3. The SOT device of claim 2, wherein the amorphous oxide material comprises an amorphous material selected from the group consisting of: B, Al, Si, SiN, Mg, Ti, Sc, V, Cr, Mn, Y, Zr, Nb, AlN, C, Ge, and combinations thereof.

4. The SOT device of claim 2, wherein the first interlayer comprising SiN, NiFeGe, Ru, RuAl, or Pt.

5. The SOT device of claim 2, wherein the second interlayer has a thickness of about 5 Å to about 15 Å.

6. The SOT device of claim 1, wherein the first spin Hall effect layer has a greater width than the first free layer and the second free layer.

7. The SOT device of claim 1, further comprising a gap layer disposed between the first free layer and the second free layer.

8. A magnetic recording head comprising the SOT device of claim 1.

9. A magnetic recording device comprising the magnetic recording head of claim 8.

10. A magnetic sensor comprising the SOT device of claim 1.

11. A spin-orbit torque (SOT) device, comprising:
    a first shield;
    a first interlayer disposed on the first shield;
    a first spin Hall effect layer disposed on the first interlayer, the first spin Hall effect layer comprising BiSb having a (012) orientation;
    a first free layer disposed over the first spin Hall effect layer;
    a gap layer disposed on the first free layer;
    a second free layer disposed over the gap layer;
    a second interlayer disposed over the second free layer, the second interlayer comprising an amorphous oxide material, wherein the first interlayer and the second interlayer comprise different materials;
    a second spin Hall effect layer disposed on the second interlayer, the second spin Hall effect layer comprising BiSb having a (001) orientation; and
    a second shield disposed over the second spin Hall effect layer.

12. The SOT device of claim 11, wherein the second interlayer has a thickness of about 5 Å to about 15 Å.

13. The SOT device of claim 11, wherein the amorphous oxide material comprises an amorphous material selected from the group consisting of: B, Al, Si, SiN, Mg, Ti, Sc, V, Cr, Mn, Y, Zr, Nb, AlN, C, Ge, and combinations thereof.

14. The SOT device of claim 11, wherein the first interlayer comprises SiN, NiFeGe, Ru, RuAl, or Pt.

15. The SOT device of claim 11, wherein the first spin Hall effect layer has a greater width than the second first spin Hall effect.

16. The SOT device of claim 11, wherein the first spin Hall effect layer and the second spin Hall effect layer have a same width.

17. A magnetic recording device comprising the SOT device of claim 11.

18. A magnetic sensor comprising the SOT device of claim 11.

19. A spin-orbit torque (SOT) device, comprising:
a substrate;
an amorphous material oxide layer disposed over the substrate;
a spin Hall effect layer disposed in contact with the amorphous material oxide layer, the spin Hall effect layer comprising BiSb having a (001) orientation; and
a free layer disposed over the spin Hall effect layer.

20. The SOT device of claim 19, wherein the amorphous material oxide layer comprises an oxidized form of an amorphous material selected from the group consisting of: B, Al, Si, SiN, Mg, Ti, Sc, V, Cr, Mn, Y, Zr, Nb, AlN, C, Ge, and combinations thereof.

21. A magnetic sensor comprising the SOT device of claim 19.

22. A magneto-resistive memory comprising the SOT device of claim 19.

23. A magnetic recording head comprising the SOT device of claim 19.

24. A magnetic recording device comprising the magnetic recording head of claim 23.

* * * * *